(12) United States Patent
Kenny et al.

(10) Patent No.: US 6,482,659 B2
(45) Date of Patent: Nov. 19, 2002

(54) POST-EPITAXIAL THERMAL OXIDATION FOR REDUCING MICROSTEPS ON POLISHED SEMICONDUCTOR WAFERS

(75) Inventors: Danny Kenny; Keith Lindberg, both of Sherman, TX (US)

(73) Assignee: GlobiTech Incorporated, Sherman, TX (US)

(*) Notice: Subject to any disclaimer, the term of this patent is extended or adjusted under 35 U.S.C. 154(b) by 0 days.

(21) Appl. No.: 10/114,899

(22) Filed: Apr. 2, 2002

(65) Prior Publication Data

US 2002/0106872 A1 Aug. 8, 2002

Related U.S. Application Data

(62) Division of application No. 09/233,253, filed on Jan. 19, 1999, now Pat. No. 6,372,521.
(60) Provisional application No. 60/072,046, filed on Jan. 21, 1998.

(51) Int. Cl.[7] .............................................. H01L 21/00
(52) U.S. Cl. ............................ 438/4; 438/478; 438/481; 438/977; 438/974
(58) Field of Search ............................ 438/4, 478, 481, 438/974, 977

(56) References Cited

U.S. PATENT DOCUMENTS 4,615,762 A * 10/1986 Jastrzebski et al. ........ 252/79.3

* cited by examiner

*Primary Examiner*—Richard Elms
*Assistant Examiner*—Beth E. Owens
(74) *Attorney, Agent, or Firm*—Jones, Day, Reavis & Pogue

(57) ABSTRACT

A method for reducing microsteps on an epitaxial layer deposited on a polished semiconductor wafer substrate by post-epitaxial thermal oxidation. The method produces very smooth semiconductor wafers by performing the steps of depositing an epitaxial layer on a wafer substrate, oxidizing a top portion of the epitaxial layer, and removing the oxidized top portion. As a result, the wafer's surface presents little or no microsteps thereon.

1 Claim, 1 Drawing Sheet

POST-EPITAXIAL THERMAL OXIDATION FOR REDUCING MICROSTEPS ON POLISHED SEMICONDUCTOR WAFERS

CROSS REFERENCES TO RELATED APPLICATIONS

The present application is a divisional and claims priority from non-provisional U.S. patent application entitled, "POST-EPITAXIAL THERMAL OXIDATION," having application Ser. No. 09/233,253, and filed on Jan. 19, 1999, now U.S. Pat. No. 6,372,521 is assigned to the present invention.

This application relies on U.S. Provisional Patent Application No. 60/072,046, entitled "Post Expitaxial Thermal Oxidation," filed Jan. 21, 1998.

TECHNICAL FIELD

This invention relates generally to semiconductor wafer production.

BACKGROUND OF THE INVENTION

In general, semiconductor wafers are prepared in several steps, including (1) growing a single crystal ingot out of molten silicon, (2) sawing the single crystal ingot into wafers, (3) shaping or lapping the wafers, (4) performing a rough polish, and (5) depositing an epilayer of silicon substrate. The epilayer is often deposited using chemical vapor, high temperature deposition to form a single crystal silicon layer on the surface of the wafer. Once the wafers have been prepared, they are provided to a fabrication facility (fab) for further processing.

As fabs are processing smaller and smaller line widths and devices are continually shrinking, the wafer surface effects the entire fab processing. Furthermore, a particle that used to be "invisible" can now completely ruin a device. Also, the of an epitaxial wafer exhibits characteristics known as "microsteps." Microsteps occur because the surface of the wafer is crystalline and when it is sawed, the surface is disoriented with respect to the crystallographic planes. Therefore, despite the wafers being sawn and polished, the resulting surface has these microsteps across its surface.

SUMMARY OF THE INVENTION

In response to the problems discussed above, described herein is a system and method for handling post-epitaxial thermal oxidation. In one embodiment, the method produces semiconductor wafers by performing the steps of forming a wafer substrate, depositing an epilayer on the substrate, oxidizing a top portion of the epilayer, and removing the oxidized top portion. As a result, the wafer includes an epi-surface that is very smooth, with little or no microsteps thereon.

DESCRIPTION OF THE PREFERRED EMBODIMENT

Figure 1A:
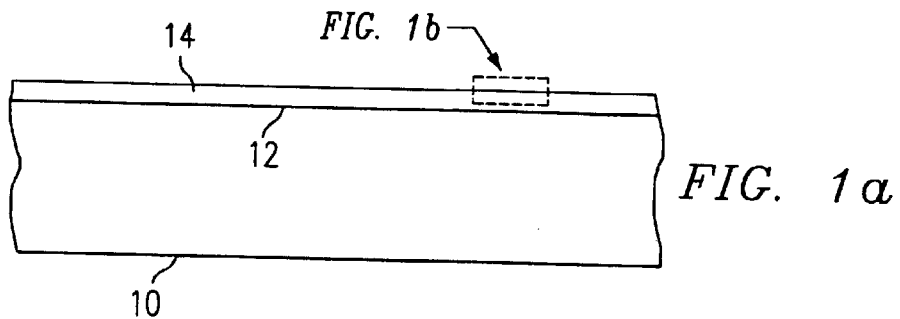
FIGS. 1a, 1b are cross-sectional views of a wafer with an epitaxial layer deposited thereon.
Figure 1B:
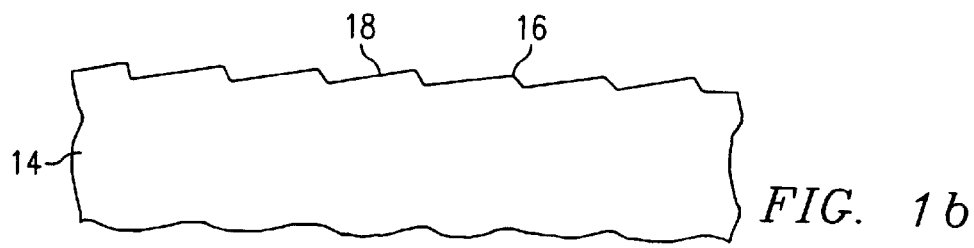

Referring to FIG. 1a, a semiconductor wafer substrate 10 has deposited on its top surface 12 an epitaxial layer 14. Fabricating an epitaxial layer on a wafer is well known in the art and will not be further discussed. However, referring to FIG. 1b, it becomes evident that small microsteps 16 are formed on a top surface 18 of the epilayer 14.

Figure 2:
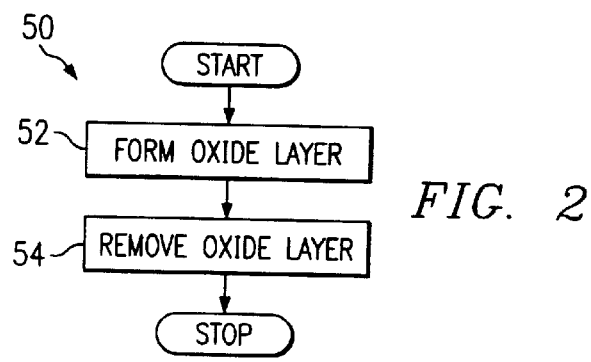
FIG. 2 is a flowchart of a method to be performed on the wafer of FIG. 1.
Figure 3:
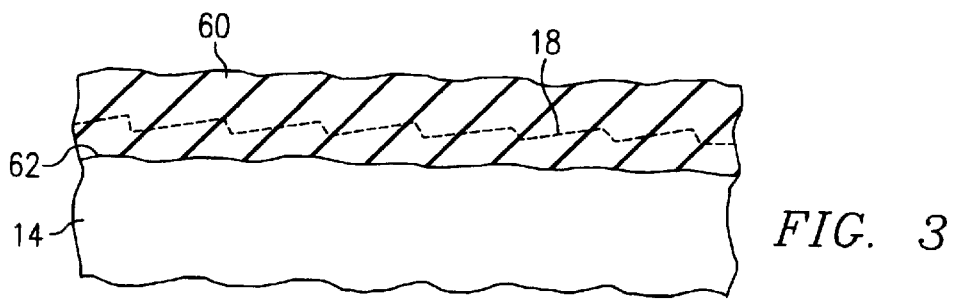
FIG. 3 is a cross-sectional view of the wafer of FIGS. 1a, 1b with an oxide layer on a top surface thereof.

Referring to FIGS. 2 and 3, a method 50 is used to reduce the size of the microsteps 16 (as well as remove any particles) from the top surface 18 of the epilayer 14. At step 52, an oxidation layer 60 is deposited or grown on the epilayer 14 using thermal oxidation. During this step 52, a portion of the epilayer (silicon) is consumed by the oxygen. As a result, the previous epi-surface 18 no longer exists and a new, smoother epi/oxide interface 62 is formed. At step 54, the oxide layer 60, including the consumed silicon that previously existed between the epi-surface 18 and the epi/oxide interface 62, is removed.

Figure 4:
FIG. 4 is a cross sectional view of the wafer of FIG. 2 after the oxide layer has been removed.

Referring to FIG. 4, as a result, a resultant epi-surface 64 is formed on the epilayer 14. The epi-surface 64 is relatively smooth, as compared with the epi-surface 18.

What is claimed is:

1. A method for reducing the size of microsteps on an epitaxial layer deposited on a polished semiconductor wafer substrate, the method comprising:

providing a semiconductor wafer;

depositing an epitaxial layer on a surface of said semiconductor wafer, wherein during the deposition of the epitaxial layer, microsteps are formed on an exposed surface of said epitaxial layer;

forming a boundary interface within said deposited epitaxial layer by thermal oxidizing at least a portion of the epitaxial layer of said semiconductor wafer including at least a portion of said exposed surface defining said microsteps, wherein said boundary interface being defined as an interface between said oxidized portion of said epitaxial layer and a portion of said epitaxial layer not oxidized, said boundary interface being relatively smoother than said exposed surface of said deposited epitaxial layer; and removing said microsteps by substantially removing the oxidized top portion of said epitaxial layer, wherein said relatively smoother boundary interface is exposed as a surface of said epitaxial layer.

* * * * *